(12) United States Patent  
Kägi

(10) Patent No.: US 7,096,656 B2  
(45) Date of Patent: Aug. 29, 2006

(54) RING TRAVELER AND METHOD FOR PRODUCING IT

(75) Inventor: Jörg Kägi, Gibswil (CH)

(73) Assignee: Bracker AG, (CH)

( * ) Notice: Subject to any disclaimer, the term of this patent is extended or adjusted under 35 U.S.C. 154(b) by 0 days.

(21) Appl. No.: 11/131,117

(22) Filed: May 17, 2005

(65) Prior Publication Data

US 2005/0252191 A1 Nov. 17, 2005

(30) Foreign Application Priority Data

May 17, 2004 (CH) .................................... 0864/04

(51) Int. Cl.  
*D01H 7/60* (2006.01)
(52) U.S. Cl. ........................................................ 57/125
(58) Field of Classification Search .................. 57/125  
See application file for complete search history.

(56) References Cited

U.S. PATENT DOCUMENTS

| 4,677,817 | A | * | 7/1987 | Kanai ........................... 57/125 |
| 5,302,422 | A | | 4/1994 | Nowak et al. |
| 6,804,943 | B1 | * | 10/2004 | Kagi ............................ 57/120 |
| 2003/0087091 | A1 | * | 5/2003 | Seiki et al. .................. 428/364 |

FOREIGN PATENT DOCUMENTS

| CH | 487 535 | 3/1970 |
| CH | 589 723 | 7/1977 |
| CH | 687 536 | 12/1993 |
| DE | 35 45 484 A1 | 7/1987 |
| DE | 38 39 920 A1 | 6/1989 |
| EP | 1 207 216 A1 | 5/2002 |
| JP | 60-99024 A | 6/1985 |
| JP | 61 006329 A | 1/1986 |
| JP | 62 028418 | 2/1987 |
| JP | 1092432 | 4/1989 |
| JP | 04343723 A | * 11/1992 |

* cited by examiner

*Primary Examiner*—Shaun R. Hurley  
(74) *Attorney, Agent, or Firm*—Adams Evans P.A.

(57) ABSTRACT

The present invention relates to a ring traveler (10) for ring spinning or ring twisting machines, with a core (20) consisting of a ferrous material, a covering layer (24) being arranged on at least parts of the core. The covering layer (24) in this case contains fine-crystalline chromium nitride, vanadium carbide or titanium carbonitride. As a result of the covering layer, the ring traveler according to the invention has good abrasion resistance and corrosion resistance.

18 Claims, 2 Drawing Sheets

RING TRAVELER AND METHOD FOR PRODUCING IT

BACKGROUND

The invention relates to a ring traveler for ring spinning or ring twisting machines and to a method for producing it.

Ring travelers of ring spinning and ring twisting machines are moved at high speed (30 m/sec. to 50 m/sec.) on rings of the corresponding ring spinning or ring twisting machines. Both the contact face between ring traveler and ring and the contact face between ring traveler and thread are subject to high wear. For rising production, however, increasingly higher running speeds of the ring travelers are required. By longer service lives being achieved, the costs should at the same time be lowered.

By the ring travelers being coated with appropriate materials, it has been possible, in recent years, to achieve a marked improvement in their running and operating properties. However, in the case of traveler speeds of above 40 m/sec., it has not been possible to obtain a sufficient improvement in wear resistance both at the thread passage and at the ring contact face.

DE 35 45 484 describes a ring traveler for a spinning machine, said ring traveler carrying a ceramic covering layer covering at least the surface region which comes into contact with the ring. The ceramic covering layer consists of one or more layers selected from a carbide layer, such as SiC, TiC, ZrC, a nitride layer, such as, for example, TiN, TiCN, ZrN, an oxide layer, such as $Al_2O_3$, $ZrO_3$, $SiO_2$, or a boride layer, such as $TiB_2$ and $ZrB_2$. The ceramic layers are applied to the core by means of the CVD or the PVD method. The coated ring travelers are subsequently quenched and ground. The titanium carbide layers and titanium nitride layers have a hardness of 1900 to 2500 HV.

CH 487 535 describes a ring traveler for spinning and twisting machines, the ring and/or the traveler being coated with a coating of titanium aluminum nitride.

CH 589 723 describes a method for the coating of inorganic substrates with carbides, nitrides or carbonitrides.

SUMMARY

The object of the present invention is to provide a ring traveler for ring spinning or ring twisting machines, which has running and operating properties improved to a greater extent. Furthermore, a method for producing this ring traveler is to be specified.

The object is achieved by means of a ring traveler with a core comprising a ferrous material, a covering layer being arranged on at least parts of the core, wherein the covering layer contains a material selected from the group consisting of fine-crystalline chromium nitride, vanadium carbide and titanium carbonitride. A method for producing the ring traveler includes heating the core to 700° C to 1200° C in a reaction chamber, introducing a precipitation gas into the reaction chamber, so that a covering layer is applied to the surface of the core, and cooling the coated ring traveler under protective gas for 2 to 4 hours.

A ring traveler according to the invention has a core consisting of a ferrous material, which has a covering layer at least in the region of the running faces with which it slides on a ring of a ring spinning or ring twisting machine or in which the thread is guided. The covering layer contains fine-crystalline TiCN (titanium carbonitride), CrN (chromium nitride) or VC (vanadium carbide).

The result of the fine-crystalline form of the covering layer is that the inherent stress of the covering layer becomes lower. No microcracks therefore occur. When microcracks occur, there is always the risk of the bursting of the covering layers, particularly when the ring traveler is put in place, and this must necessarily lead to the exchange of these ring travelers. The ring travelers according to the invention therefore have a greatly improved wear resistance at the thread passage and at the ring contact face. The wear rate, as compared with ring travelers with a conventional ceramic layer, electroplating or nickel dispersion coating, falls by approximately 80%, and the useful life of a ring traveler is prolonged 3 to 10 times, that is to say to 500–1500 operating hours. The operating costs fall significantly as a result. Owing to the covering layer, the ring traveler according to the invention has good abrasion resistance and corrosion resistance.

In a preferred embodiment, the covering layer contains fine-crystalline TiCN, particularly preferably pure fine-crystalline TiCN, which has a hardness of HV 0.025 of 2600 to 3600. TiCN is hard and at the same time relatively tough, which makes it particularly suitable as a covering layer of the ring traveler according to the invention.

In a preferred embodiment, an intermediate layer, which contains TiN, is applied as adhesion promoter between the covering layer and the core. It would also be possible, instead of TiN, to use other metal nitrides, such as, for example, CrN. The titanium nitride layer has extremely good affinity with the ferrous material, thus increasing the stability of the ring traveler in the long term. Thus, for example, burstings of material can be prevented. The intermediate layer may be single-ply or multi-ply. The covering layer consisting of fine-crystalline titanium carbonitride, chromium nitride or vanadium carbide can easily be applied to the intermediate layer containing titanium nitride.

The covering layer of the ring traveler according to the invention may be single-ply or multi-ply. In a preferred embodiment, it is multi-ply. The covering layer has a thickness of 0.1 to 20 μm, preferably of 4 to 10 μm. The thicker the covering layer, the more wear-resistant the ring traveler.

In a particularly preferred embodiment, the covering layer is applied over the entire area to the core or to the intermediate layer.

The ferrous material of the ring traveler may be any desired form of steel, but the core of the ring traveler consists particularly suitably of an unalloyed tool steel, cold work steel, a spring steel or a high-speed steel.

The ring traveler according to the invention is produced by at least parts of the core being covered with a covering layer. In this case, in a first step, the core is heated to 700° to 1200° C. in a reaction chamber. Subsequently, a precipitation gas is introduced into a reaction chamber, so that a layer with fine-crystalline titanium carbonitride, chromium nitride or vanadium carbide is applied to the surface of the core. Subsequently, the coated ring traveler is cooled slowly for 2 to 4 hours under protective gas. The slow cooling of the coated ring traveler under protective gas constitutes an essential method step, since only in this way is it possible to ensure that the covering layer obtained has a crystallized needle structure, that is to say is fine-crystalline, and consequently has very low inherent stress.

In a preferred embodiment, the cooled ring traveler is posthardened, in that the hardening temperature is adapted to the core carbon, for example is maintained at 840° C. and for 30 minutes.

In a further preferred embodiment, the posthardened ring traveler is quenched in a thermal bath (oil at a temperature of 80° C. or a hot bath at 170–260° C.) and is tempered at 200 to 350° C. for 0.5 to 1.5 hours, that is to say is subjected to heat treatment. The ring traveler thereby acquires greater toughness and elasticity, thus ensuring a longer operating time of the ring traveler and having a highly beneficial effect on layer adhesion.

In a preferred embodiment of the invention, the surface of the ring traveler is additionally polished before and/or after coating, so that a thread-fine surface is obtained. Suitable polishing means are, for example, diamond-containing pastes or abrasives which are above the hardness of the covering layer.

The core is ideally degreased before coating.

The ring travelers according to the invention may be used both in spinning mills and in twisting mills. Their good running properties, such as, for example, good sliding and low wear, come into particularly advantageous effect in cooperation with coated steel rings, but they may also be used on other rings, such as, for example, on sintered or uncoated rings.

The ring travelers according to the invention with a fine-crystalline titanium carbonitride covering layer can be used universally, but they are suitable, in particular, for ring travelers which are exposed to relatively high forces or when there is a lack of lubrication.

The ring travelers according to the invention with a fine-crystalline vanadium carbide covering layer can likewise be used universally, but are particularly preferred when work is carried out at a very high running speed, since the fine-crystalline vanadium carbide covering layer is extremely hard, that is to say has a hardness of 3000–4000 HV. In principle, the use of a coarse-grain vanadium carbide covering layer may also be envisaged here.

The ring travelers according to the invention with a fine-crystalline chromium nitride covering layer can likewise be used universally, but are used particularly preferably in the production of blended yarns, since the covering layer is highly corrosion-resistant, and in the production of synthetic yarns, softeners and chlorine-containing fibers, which, of course, increases corrosion. In principle, the use of a coarse-grain chromium nitride covering layer may also be envisaged here.

BRIEF DESCRIPTION OF THE DRAWINGS

The ring traveler according to the invention is explained in more detail below with reference to exemplary embodiments shown in the drawings in which, purely diagrammatically.

DETAILED DESCRIPTION

Figure 1A:
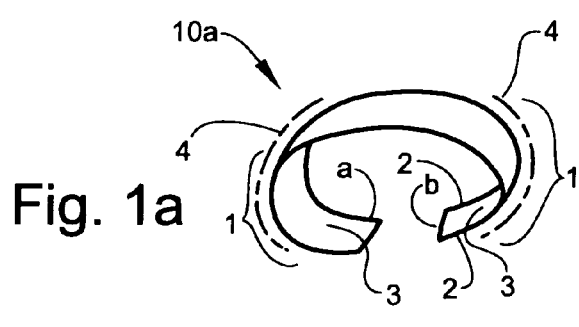
FIG. 1a–1f show various embodiments of ring travelers.
Figure 1D:
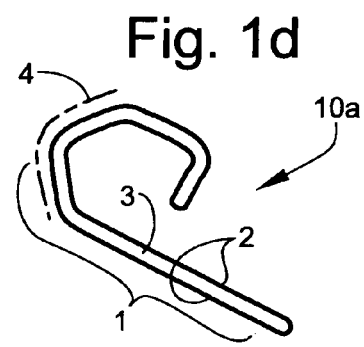
Figure 1B:
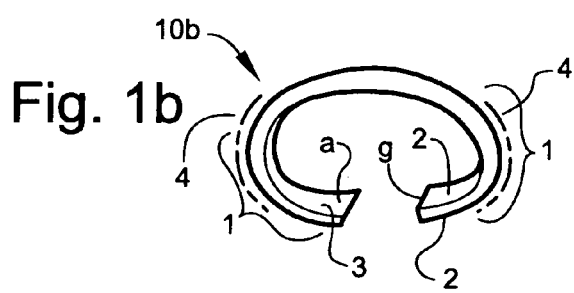
Figure 1E:
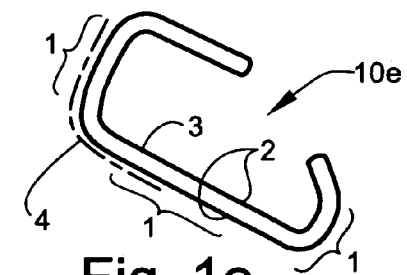
Figure 1C:
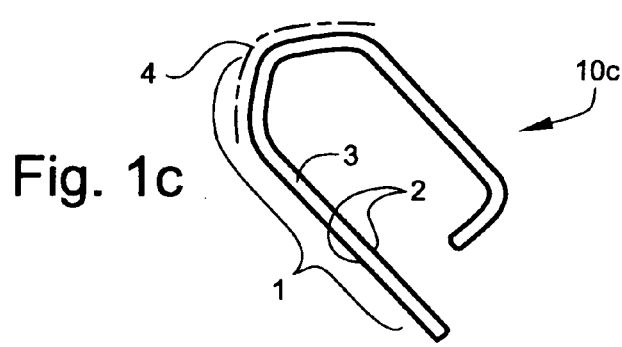
Figure 1F:
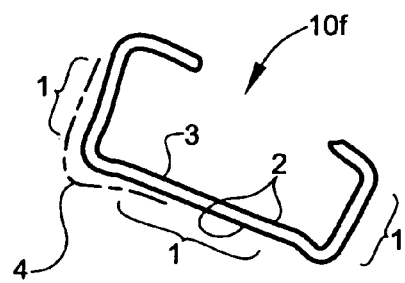

FIGS. 1a to 1f show ring travelers 10a, . . . , 10f in various embodiments. FIGS. 1a and 1b show C-shaped ring travelers 10a, 10b, such as are typically used on T-flange rings of ring spinning or ring twisting machines. FIGS. 1c to 1f, by contrast, show lug-shaped and hook-shaped ring travelers 10c, . . . , 10f. The ring travelers 10c and 10d are employed on oblique-flange rings, the ring travelers 10e on conically running flange rings and the ring travelers 10f on vertically running flange rings.

Those regions of the ring travelers 10a, . . . , 10f which during operation form the running faces sliding on the flange rings are identified in each case by 1. Thus, with regard to the C-shaped ring travelers 10a, 10b, because of their symmetrical configuration, both flanks a, b may serve as a running face. In the case of a lug flange or oblique flange and SU ring travelers 10c, . . . , 10f, the region 1 of the running faces is defined clearly by the shape.

The ring travelers 10 or 10a, . . . 10f according to the invention may be produced in the embodiments shown in FIG. 1a, . . . , 1f or in any desired further embodiments.

A ring traveler 10 according to the invention has an uncoated core 20 consisting of a ferrous material. A covering layer 24 consisting of fine-crystalline chromium nitride, vanadium carbide or titanium carbonitride is arranged on the core, at least in the region 1 of the running faces with which the latter is guided on a ring of a ring spinning or ring twisting machine. The thread passage lies in this case in the regions, designated by 4, of the ring travelers 10a, . . . 10f.

In the region of the running face 1, primarily, an inside, designated by 3, of the ring traveler 10 must be wear-resistant and be equipped with good sliding properties and therefore have a covering layer. In the event of appropriate thread tension, it may be that the ring traveler runs along, tilted sideways, on a ring, so that it may prove advantageous also to provide the two end faces 2 with a covering layer.

Figure 2:
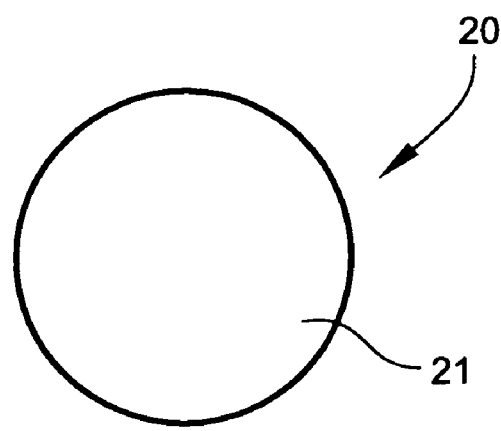
FIG. 2 shows a section through the core of a ring traveler before its machining.

FIG. 2 shows a section through the core 20 of an untreated ring traveler 10. The ferrous material 21 of the core 20 is preferably an unalloyed or low-alloy carbon steel, preferably the ferrous material is an unalloyed tool steel, cold work steel or high-speed steel. The core is or may be hardened or unhardened before coating.

In a preferred embodiment, the surface of the core is polished before coating. The core is ideally additionally degreased before coating. An optimum layer adhesion of the covering layer on the core is thereby ensured.

Figure 3:
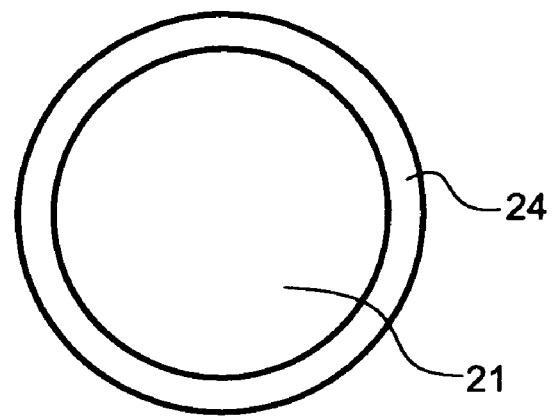
FIG. 3 shows a section through a first embodiment of the ring traveler according to the invention, in which the covering layer is applied directly to the core.

FIG. 3 shows a section through a first embodiment of the ring traveler according to the invention, in which the covering layer is arranged directly on the core. The ring traveler is coated preferably over the entire area with a covering layer 24, although it is also possible to provide with a covering layer 24 only the regions which are subjected to high mechanical and/or chemical stress. As mentioned above under FIG. 1, particularly in the region of the running face 1, an inside, designated by 3, of the ring traveler 10 must be wear-resistant and be equipped with good sliding properties and therefore have a covering layer. It may likewise be advantageous to provide the two end faces 2 with a covering layer 24.

The ring traveler according to the invention is obtained in that the preferably hardened, polished and degreased core is heated to 700° to 1200° C. in a reaction chamber. In this case, the hardness in the core is reduced to HV 100–400. Subsequently, a precipitation gas is introduced into the reaction chamber according to the CVD method (chemical vapor deposition). If the covering layer contains titanium carbonitride, the precipitation gas used is $CH_3CN$ and $TiCl_4$. The precipitation gases used in the production of the chromium nitride layer or vanadium carbide layer are known to a person skilled in the art. In this case, a layer with fine-crystalline titanium carbonitride, chromium nitride or vanadium carbide is applied to the surface of the core. This method may be applied more than once, so that a plurality of plies of the covering layer are obtained. Between the application of the individual plies of the covering layer, the ring traveler is in each case preferably cooled. Subsequently, the coated ring traveler is cooled for 2 to 4 hours under protective gas, preferably under nitrogen. The covering layer thus obtained has a crystallized needle structure. The ring traveler thus obtained is subsequently preferably posthardened, quenched in hot oil or a hot bath and tempered at 285° C. for one hour. Finally, the ring travelers may also be polished, in order to obtain a thread-fine surface.

Figure 4:
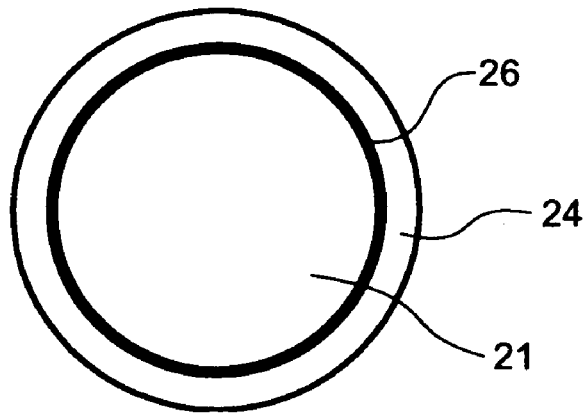
FIG. 4 shows a section through a second embodiment of the ring traveler according to the invention, in which the covering layer is applied to an intermediate layer formed between the covering layer and the core.

FIG. 4 shows a section through a second embodiment of the ring traveler according to the invention, in which an intermediate layer 26 is arranged between the covering layer 24 and the core 20 consisting of the ferrous material 21. The intermediate layer preferably contains TiN. The titanium nitride layer has an extremely good affinity with the ferrous material, thus increasing layer adhesion within the ring traveler. The intermediate layer, having a thickness of approximately 0.5 µm, is applied by the same method as the covering layer. That is to say, the preferably hardened, polished and degreased core is heated to 700° to 1200° C. in a reaction chamber. Subsequently, a precipitation gas is introduced into the reaction chamber according to the CVD method (chemical vapor deposition). The intermediate layer is arranged preferably over the entire area on the core in exactly the same way as the covering layer, although it is also possible to apply the intermediate layer only at the points which are subjected to high mechanical stress and which were mentioned above. After the application of the intermediate layer, the covering layer is applied to the ring traveler, as described above. After the slow cooling under protective gas, the ring traveler is, if appropriate, posthardened, quenched in oil or a hot bath, tempered and/or polished.

I claim:

1. A ring traveler (10) for ring spinning or ring twisting machines, with a core (20) comprising a ferrous material, a covering layer (24) being arranged on at least parts of the core, wherein the covering layer contains a needle-like fine crystalline structure of a material selected from the group consisting of chromium nitride, vanadium carbide and titanium carbonitride.

2. The ring traveler (10) as claimed in claim 1, wherein the covering layer (24) contains fine-crystalline titanium carbonitride.

3. The ring traveler (10) as claimed in claim 1, wherein the covering layer (24) is single-ply.

4. The ring traveler (10) as claimed in claim 1, wherein the covering layer (24) is multi-ply.

5. The ring traveler (10) as claimed in claim 1, wherein an intermediate layer (26), which is selected from the group of titanium nitride and chromium nitride, is arranged between the covering layer (24) and the core (20).

6. The ring traveler (10) as claimed in claim 1, wherein the covering layer (24) is arranged over the entire area on the core (20).

7. The ring traveler (10) as claimed in claim 1, wherein the ferrous material of the core (20) is an unalloyed tool steel, cold work steel, a spring steel or a high-speed steel.

8. The ring traveler (10) as claimed in claim 1, wherein the covering layer has a thickness of 0.1 to 20 µm.

9. The ring traveler (10) as claimed in claim 1, wherein the covering layer (24) of the ring traveler is polished.

10. The ring traveler (10) as claimed in claim 1, wherein the covering layer (24) has an HV 0.025 of 2600 to 4000.

11. A ring traveler (10) for ring spinning or ring twisting machines, with a core (20) consisting of a ferrous material, a covering layer (24) being arranged on at least parts of the core, wherein the covering layer (24) has a needle-like fine-crystalline structure consisting essentially of chromium nitride and vanadium carbide.

12. A method for producing a ring traveler (10) with a core (20) comprising ferrous material, at least parts of the core being covered with a covering layer (24) containing TiCN, CrN or VC, in which method the core is heated to 700° C to 1200° C. in a reaction chamber, a precipitation gas is introduced into the reaction chamber, so that a covering layer (24) is applied to the surface of the core, and the coated ring traveler is cooled, wherein the ring traveler is cooled under protective gas for 2 to 4 hours.

13. The method as claimed in claim 12, wherein the precipitation gas contains $CH_3CN$ and $TiCl_4$.

14. The method as claimed in claim 12, wherein an intermediate layer consisting of titanium nitride or chromium nitride is arranged on the core.

15. The method as claimed in claim 12, wherein the cooled ring traveler is posthardened.

16. The method as claimed in claim 15, wherein the posthardened ring traveler is quenched in a hot bath and is tempered at a temperature of 200–350° C. for 0.5 to 1.5 hours.

17. A method of forming a ring traveler (10) comprising the steps of:
    (a) providing a core (20) comprising a ferrous material;
    (b) heating the core (20) in a reaction chamber to between about 700° C. and 900° C;
    (c) introducing into the reaction chamber a precipitation gas consisting of $CH_3CN$ and $TiCl_4$
    (d) precipitating a coating of the precipitation gas onto a surface of the core (2); and
    (e) cooling the coated core (20) under a protective gas for about 2 to 4 hours.

18. A ring traveler for ring spinning or ring twisting machines, with a core comprising a ferrous material, at least parts of the core being covered with a covering layer containing TiCN, CrN or VC, the ring traveler being coated by the steps of: heating the core to 700° C. to 1200° C. in a reaction chamber; introducing a precipitation gas into the reaction chamber, so that a covering layer is applied to the surface of the core; and cooling the ring traveler under protective gas for 2 to 4 hours.

* * * * *